(12) United States Patent
Celler et al.

(10) Patent No.: US 6,388,290 B1
(45) Date of Patent: May 14, 2002

(54) SINGLE CRYSTAL SILICON ON POLYCRYSTALLINE SILICON INTEGRATED CIRCUITS

(75) Inventors: George K. Celler, New Providence; Yves Jean Chabal, Holmdel, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/095,468

(22) Filed: Jun. 10, 1998

(51) Int. Cl.[7] .............................................. H01L 27/01
(52) U.S. Cl. .................. 257/350; 257/524; 438/459; 438/381; 428/446
(58) Field of Search ................................ 438/406, 455, 438/459, 238, 311, 381; 257/347, 350, 379, 524, 528, 656

(56) References Cited

U.S. PATENT DOCUMENTS

| | | | | |
|---|---|---|---|---|
| 5,449,953 A | * | 9/1995 | Nathanson et al. | 257/728 |
| 5,559,359 A | * | 9/1996 | Reyes | 257/453 |
| 5,849,627 A | * | 12/1998 | Linn et al. | 438/455 |
| 5,934,312 A | * | 8/1999 | Lyer et al. | 438/459 |
| 5,986,331 A | * | 11/1999 | Letavic et al. | 257/664 |

FOREIGN PATENT DOCUMENTS

| | | |
|---|---|---|
| EP | 0688048 | 12/1995 |
| EP | 0878844 | 11/1998 |
| JP | 62179110 | 8/1987 |
| JP | 05055359 | 3/1993 |
| WO | WO9702598 | 1/1997 |

OTHER PUBLICATIONS

ZR. Hu et al., Contact Effects on HF Loss of CPW High Resistivity Silicon Lines. 1996 IEEE pp. 299–302.*
M.H. Hanes et al., MICROX—an All–Silicon Technology for Monolithic Microwave Integrated Circuits, 1993 IEEE, pp. 219–221.*
M. Vorwerk et al., A 1.8 GHz Low–Noicce Amplifier in CMOS/SIMOX Technology. 1998 IEEE, 31–34.*
A.C. Reyes et al., Theoretical and Experimental Investigation of Bias and Temperature Effects on High Resistivity Silicon Substrates for RF Applications. 1998 IEEE, pp. 1069–1072.*
S. MahaJan, L.C. Kimerling "Concise Encyclopedia of Semiconducting Materials & Related Technologies" Oxford ; New York : Pergamon Press, 1992, p. 214–217.*

* cited by examiner

Primary Examiner—Olik Chaudhuri
Assistant Examiner—Anh Duy Mai
(74) Attorney, Agent, or Firm—Lowenstein Sandlar PC

(57) ABSTRACT

An integrated circuit comprising active and passive devices is formed in a thin slice of monocrystalline semiconductor bonded to a high resistivity polycrystalline silicon substrate. As compared with conventional integrated circuits supported on a monocrystalline substrate, circuits in monocrystalline films bonded to high resistivity polycrystalline substrates are less subject to parasitic capacitance, crosstalk and eddy currents. As compared with typical SOI wafers, the polycrystalline substrates have higher resistivity, and this resistivity is much less affected by contamination than it would be in monocrystalline substrates. Compared to silicon-on-sapphire or silicon on any other insulating material, the polycrystalline substrates are more compatible with the mechanical, thermal, and optical properties of the crystalline silicon layer.

7 Claims, 2 Drawing Sheets

SINGLE CRYSTAL SILICON ON POLYCRYSTALLINE SILICON INTEGRATED CIRCUITS

FIELD OF THE INVENTION

The present invention relates to integrated circuits and, in particular, to a new type of integrated circuit comprising active and passive devices formed in a thin slice of single crystal semiconductor bonded to a high resistivity polycrystalline silicon substrate.

BACKGROUND OF THE INVENTION

Conventional integrated circuits are typically fabricated on relatively thick wafers of monocrystalline silicon. While only a thin top layer of the silicon, typically less than a micrometer in thickness, is utilized by the circuit devices, the wafers are typically about 0.5 to 0.8 mm in thickness in order to provide required mechanical rigidity. Such wafers are utilized in the fabrication of integrated circuits using a variety of technologies, including CMOS, NMOS, bipolar and BiCMOS technologies.

These conventional integrated circuits are not well suited for high frequency applications because of the relatively low resistivity of the silicon underlying the active region. With increasing switching speed of digital circuits and increasing frequency of operation of analog circuits, the underlying crystalline silicon leads to a variety of adverse parasitic effects. Specifically, the underlying silicon contributes to the parasitic capacitance of each transistor and introduces parasitic capacitance with the interconnection wires. When both digital and analog circuits are formed on the same wafer, the underlying silicon contributes to crosstalk between the two types of circuits. And when the wafer includes high frequency inductors, eddy currents induced in the substrate dampen the resonance of associated circuits and reduce the quality factor Q of the inductors.

Although various approaches have been tried to solve these problems, none have proved completely satisfactory. One approach, referred to as the silicon on insulator (SOI) technique is commonly implemented by forming the integrated circuit in a film of single crystal silicon separated from a single crystal silicon substrate by a layer of insulating silicon oxide. SOI usually improves the circuit performance, primarily by reducing parasitic capacitance of the transistors. It also may decrease the cross talk between different parts of the circuit. There are two common implementations of SOI. In the first, a high dose of oxygen is implanted into single crystalline Si and after suitable heat treatment this leads to formation of a buried insulating silicon oxide film. This process is known as the SIMOX (Separation by IMplanted OXygen) process. In the second implementation, two single crystalline Si wafers, at least one of which is coated with a layer of silicon dioxide, are bonded together and then one of the wafers is thinned until only a film of silicon remains. All these SOI wafers, whether formed by SIMOX or by bonding, typically consist of a device layer that is separated by silicon oxide (usually silicon dioxide) from a single crystalline substrate that is not intentionally doped. The substrate conductivity is typically in the range 0.1 to 50 ohm-cm because of residual impurities.

Although such SOI wafers are beneficial for most high speed circuits, they are not well suited for circuits that include integrated inductors. Inductors perform better when mounted on insulating or very highly resistive substrates. A typical SOI substrate does not provide such a substrate. There have been some published attempts to increase the substrate resistivity. For example, a group at Westinghouse has developed a process, in which very high purity (very high resistivity, of the order of 10 KOhm-cm) float-zone Si is used as the staring material for SIMOX. The same approach has been followed more recently by D. Figgert et al, "A SOI-RF-CMOS Technology on High Resistivity SIMOX Substrates for Microwave Applications to 5 GHz", *IEEE Trans. Electr. Dev.*, Vol. 44, p. 1981 (1997). Both teams have reported that circuits with improved performance can be built. However, there are problems with this method. The first problem is the difficulty of maintaining the very high purity of the float zone material through many high temperature steps required to make SOI wafers, and later the high temperature steps in the conventional device processing cycle. Any impurities inadvertently introduced into Si will diffuse at high processing temperatures throughout the wafer, making it more conductive. The second problem is that the float-zone process does not readily permit fabrication of large diameter wafers. Equipment for growing 150 mm silicon boules is only becoming available, and there are major technical challenges in scaling the process to larger diameters. In contrast, standard wafers made by the Czochralski or CZ process are readily available in 200 and 300 mm diameters and the semiconductor industry is starting conversion to 300 mm wafers. The third problem is that the cost of high purity float-zone wafers significantly exceeds that of CZ wafers.

An earlier SOI technique involved forming a silicon layer on a sapphire insulating substrate. This approach also used a relatively expensive substrate material, and the mechanical and thermal properties of the crystalline silicon film do not closely match those of the substrate.

Yet another approach is to abandon silicon technology and to fabricate the desired circuits in GaAs on a semi-insulating substrate. Unfortunately, GaAs technology is less developed and intrinsically much more expensive than silicon technology. Accordingly there is a need for an improved structure for high frequency integrated circuits.

SUMMARY OF THE INVENTION

In accordance with the invention, an integrated circuit comprising active and passive devices is formed in a thin slice of monocrystalline semiconductor bonded to a high resistivity polycrystalline silicon substrate. As compared with conventional integrated circuits supported on a monocrystalline substrate, circuits in monocrystalline films bonded to high resistivity polycrystalline substrates are less subject to parasitic capacitance, crosstalk and eddy currents. As compared with typical SOI wafers, the polycrystalline substrates have higher resistivity, and this resistivity is much less affected by contamination than it would be in monocrystalline substrates. Compared to silicon-on-sapphire or silicon on any other insulating material, the polycrystalline substrates are more compatible with the mechanical, thermal, and optical properties of the crystalline silicon layer.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for illustrating the concepts of the invention and are not to scale.

DETAILED DESCRIPTION

Figure 1:
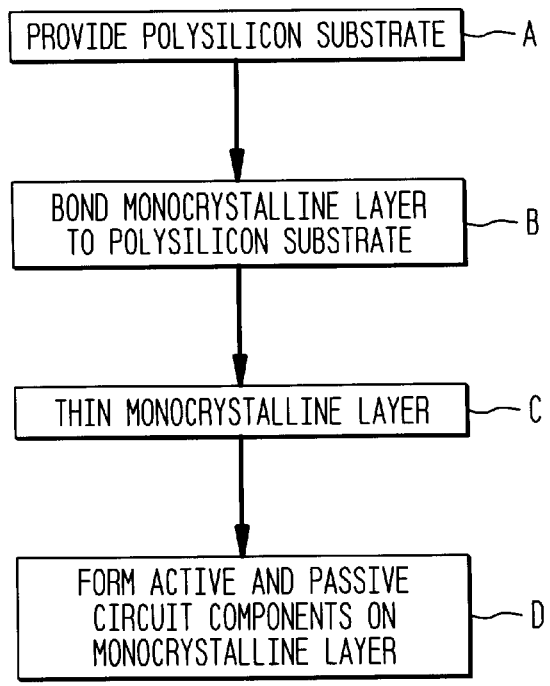
FIG. 1 is a schematic flow chart illustrating the steps in making an integrated circuit in accordance with the invention.

Referring to the drawings, FIG. 1 is a schematic flow chart showing the steps in making an integrated circuit. The first step shown in block A of FIG. 1 is to provide a polysilicon substrate. Preferably the polysilicon substrate is in the form of a wafer comparable in dimensions to the monocrystalline wafers used in conventional integrated circuit fabrication. We will refer to such a polycrystalline silicon wafer as a "handle wafer". The polysilicon should have a high resistivity in excess of 1 KOhm-cm and preferably in excess of 10 KOhm-cm.

The, substrate can be sliced from polycrystalline ingots (thick rods) that are currently mass produced as the precursor material for growing monocrystalline wafers. Instead of the polycrystalline rod being subjected to the float-zone process for converting it into monocrystalline form, the rod is annealed and sliced using methods similar to those used in handling conventional single crystalline wafers. The polycrystalline wafer is then mechanically and chemically polished to form a handle wafer.

The next step, shown in block B, is to bond a layer of monocrystalline semiconductor on the polycrystalline silicon handle wafer. Preferably this is accomplished by bonding a thin monocrystalline wafer to the polycrystalline wafer. The monocrystalline wafer is preferably monocrystalline silicon but can also be a different semiconductor such as monocrystalline GaAs, SiC or InP. As preliminary steps, the two wafers to be bonded should be chemically degreased and thoroughly cleaned.

Bonding is typically effected by placing the two clean wafers in contact and heating. When placed in contact under gentle pressure, the wafers are initially held together by weak physical forces such as hydrogen bonding among surface terminal hydroxyl groups and van der Waals forces between the surface species. With heating the weak physical bonds are transformed into strong chemical bonds by thermally induced chemical reactions. Such bonding can be achieved between single crystal silicon and polycrystalline silicon surfaces by heating to 1100° C. without the use of any other bonding agent. A thin layer of silicon oxide (20–1000 nm) facilitates the bonding process and improves performance of subsequently fabricated devices.

The third step, block C, is to thin the monocrystalline layer. Thinning can be effected by grinding and etching using etch stops. The monocrystalline layer is reduced to a thickness of less than 15 micrometers and preferably to one micrometer or less. Alternatively, a thinning process referred to as the Smart Cut process can be utilized. Here hydrogen is implanted into monocrystalline silicon before bonding. For a sufficient hydrogen dose, damage and hydrogen microbubbles form in silicon at a depth that is defined by the implantation energy, as described by M. Bruel, "Application of Hydrogen Ion Beams to Silicon on Insulator Material Technology", Nucl. Instr. and Meth. in Phys. Res. B, Vol 108, p. 313, (1996). When two wafers are pressed together and heated, the implanted wafer splits into two parts along the implanted zone, leaving a thin silicon film bonded to another wafer.

Figure 2:
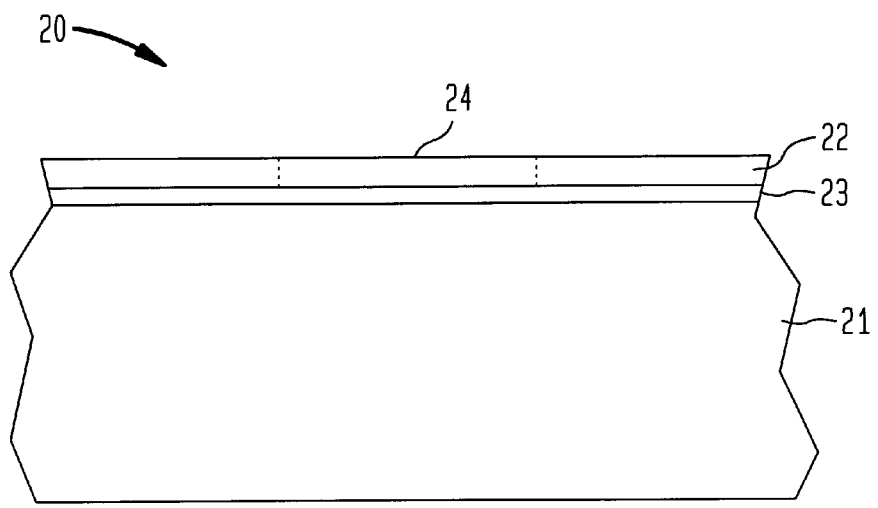
FIG. 2 is a schematic cross section of the structure on which an integrated circuit can be formed.

A typical workpiece at this stage of the process is shown in FIG. 2. The workpiece 20 comprises a bonded sandwich structure of a relatively thick polysilicon substrate 21 and thin monocrystalline outer layer 22. An optional intervening insulating layer 23 such as silicon oxide improves performance of subsequently fabricated devices. For high speed digital CMOS, the top layer is preferably monocrystalline silicon having a thickness less than one micrometer. The buried oxide is typically between 5 and 3000 nanometers, and the substrate is a polycrystalline silicon wafer having a thickness in excess of 0.1 millimeter and preferably about 0.5 millimeter or thicker. The dimensions of the overall structure can be similar to those of a conventional monocrystalline wafer for convenience in processing. The structure can then be substituted for the conventional crystalline silicon wafer in conventional silicon integrated circuit fabrication processes.

The final step is to fabricate one or more integrated circuits by forming active devices such as transistors and passive devices such as resistors, capacitors and inductors to form an integrated circuit 24 on and in the monocrystalline layer 22. These devices can be formed in accordance with the well known techniques used to form them in monocrystalline silicon wafers.

Since the top monocrystalline layer is not as highly resistive as the handle wafer below it, it may be advantageous to either remove it or transform it into insulating oxide in the areas that are going to be occupied by inductors. This can be done simply, and most likely without adding any extra steps to the process sequence. For example: the most common isolation techniques used to electrically separate neighboring transistors are LOCOS (local oxidation) and STI (shallow trench isolation). In LOCOS, a thick oxide is grown between devices, in STI trenches are etched and filled with a deposited oxide layer. Therefore, the same lithography steps that are used for lateral isolation, can define the inductor areas and by the time the isolation sequence is completed, there is only an insulating layer between the inductor metal on the surface and the polycrystalline handle wafer.

The advantages of such integrated circuits are manyfold. The polycrystalline silicon substrates provide extremely high resistivity (>10 KOhm-cm) which approaches the levels provided by insulators. The substrates are relatively insensitive to contamination with electrically active impurities such as boron, and the substrates have mechanical and thermal properties closely matching the thin monocrystalline silicon layer. Consequently, the resulting wafers are robust during processing and it is now possible to place high speed digital circuits, RF analog circuits and high performance RF passive components all on the same substrate. This permits fabrication of more compact, higher speed, lower power, and lower cost integrated circuits for wireless communications and other applications.

Figure 3:
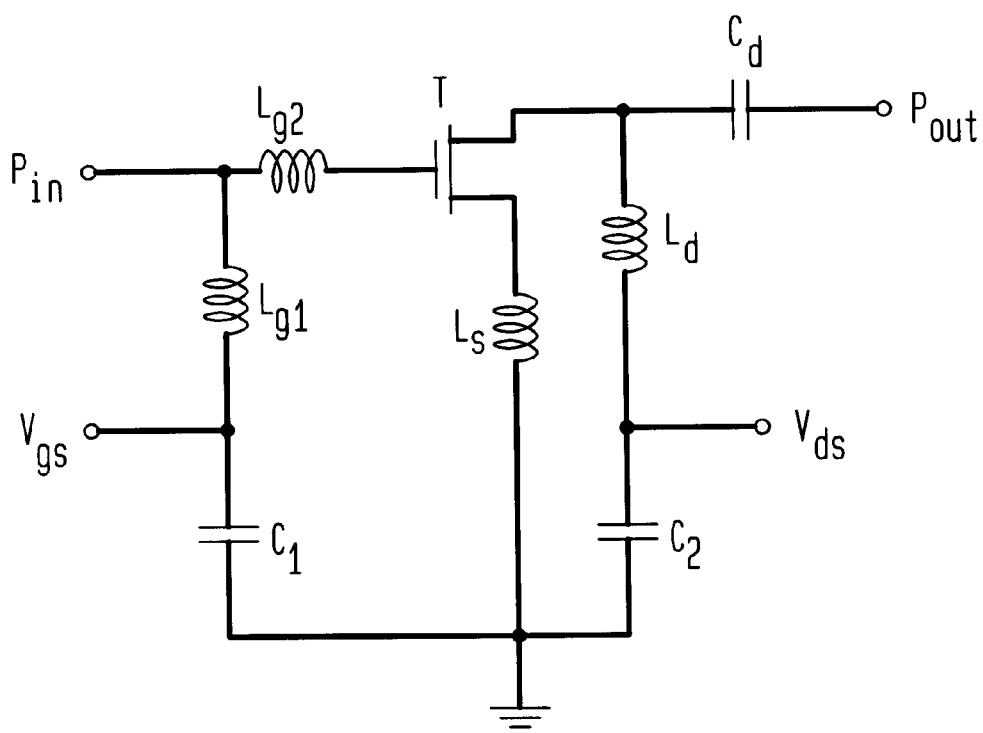
FIG. 3 is a schematic diagram of an integrated circuit which can be formed on the structure of FIG.2.

The preferred applications are rf circuits containing inductors such as low-noise amplifiers, bandpass filters and voltage controlled oscillators. FIG. 3 is a schematic circuit diagram depicting a single stage low-noise amplifier which can be implemented on a FIG. 2 structure. The circuit 30 includes an active device in the form of transistor T and passive devices such as inductor $L_{g1}$ and capacitor $C_1$. Typical circuit parameters are: $L_{g1}$=14.84 mH, $L_{g2}$=4.4 mH, $L_s$=0.3 mH, $L_d$=2.6 mH, $C_1$=20 pF, $C_d$=12 pF and $C_2$=18.5 pF. The circuit can be implemented using MOS fabrication techniques and spiral inductors. Further details are described in R. A. Johnson et al, "Advanced Thin-Film Silicon-On-Saphire Technology: Microwave Circuit Applications" IEEE Transactions on Electron Devices, Vol. 45, No. 5, pp. 1047–1053 (May, 1998), which is incorporated herein by reference. A suitable band-pass filter circuit, an alternative low-noise amplifier circuit and a voltage controlled oscillator circuit are described by J. Burghartz et al in "RF Circuit Design Aspects of Spiral Inductors on Silicon," 1998 *IEEE International Solid State Circuits Conference*, Paper FP 16.1, pp. 246–247 (1998), which is incorporated herein by reference. The circuits can be implemented using BiCMOS fabrication techniques.

The invention can be better understood by consideration of the following specific example.

EXAMPLE

Pairs of scribed monocrystalline and polycrystalline silicon wafers are chemically polished so that the root mean square roughness is close to 1 angstrom within a 10 micron square area. A standard thick oxide (100–1000 nm) is grown on the monocrystalline wafer while the polycrystalline wafer remains covered with native oxide. The wafers are then chemically degreased by dipping into:

1. hot trichlorethane;
 2. acetone; and
 3. methanol, with thorough drying between dips.

The wafers are inspected for quality and brushed scrubbed to remove large particles.

At this point the wafers are chemically cleaned by the following process:

1. Rinsing in deionized (DI) water
 2. 10 minutes in a hot (80° C.) 4:1:1 mixture of $H_2O:H_2O_2:NH_4OH$
 3. Thorough rinsing in DI water
 4. 10 minutes in a hot (80° C.) 4:1:1 mixture of $H_2O:H_2O_2:HCl$
 5. Thorough rinsing in DI water; and
 6. Final brush scrub.

The strafers are then transported to a bonding station where each pair is positioned facing each other with a 4 mm spacing. A jet of DI particle-free water is sprayed between the two wafers while a slow rotation (one revolution per minute) is established. Spraying is done for three minutes. The wafers are then spun at 3000 rpm for 5 minutes while heat is applied by a high intensity IR lamp (300 W) located 5" from the top wafer.

As soon as the rotation is stopped, the top wafer is dropped onto the bottom wafer and gentle pressure is applied at the center of the pair to initiate the joining. The pair is then checked with an IR lamp and in an acoustic microscope, before being placed in an oven to be annealed to 1100° C. Annealing transforms the weak physical bonds into strong chemical bonds via thermally induced chemical reactions. The wafers are again inspected for voids that may have developed during annealing, both with the acoustic microscope and IR transmission.

The result is a composite wafer with a thin layer of monocrystalline silicon bonded to the surface of a polycrystalline substrate. The wafer is suitable for conventional silicon integrated circuit fabrication using processing equipment designed for conventional monocrystalline wafers.

It is to be understood that the above-described embodiments are illustrative of only a few of the many possible specific embodiments which can represent applications of the principles of the invention. For example, there are a wide variety of methods for cleaning and bonding that can be used in the process. Thus numerous and varied other arrangements can be made by those skilled in the art without departing from the spirit and scope of the invention.

What is claimed is:

1. A circuit device comprising:

a substrate comprising polycrystalline silicon, said polycrystalline silicon having a thickness in excess of about 0.1 millimeter and a resistivity in excess of about 10 K Ohm-cm;

a thin layer of monocrystalline semiconductor bonded to said substrate, said layer having a thickness of less than about 15 micrometers; and an integrated circuit formed on said layer of monocrystalline semicrystalline semiconductor, the integrated circuit comprising at least one inductor.

2. A circuit device according to claim 1 wherein said monocrystalline semiconductor comprises monocrystalline silicon.

3. A circuit device according to claim 2 wherein said substrate has a thickness of about 0.5 millimeter or more.

4. A circuit device according to claim 3 wherein said layer of monocrystalline silicon has a thickness of about 1 micrometer or less.

5. A circuit device according to claim 2 wherein a layer of silicon oxide is disposed between said polycrystalline silicon and said monocrystalline silicon.

6. A circuit device according to claim 5 wherein said layer of silicon oxide has a thickness in the range 20 to 1000 nanometers.

7. A circuit device according to claim 2 wherein said integrated circuit includes at least one active electronic device and at least one passive device.

\* \* \* \* \*